(12) United States Patent
Fan

(10) Patent No.: US 12,380,940 B2
(45) Date of Patent: Aug. 5, 2025

(54) SEMICONDUCTOR DEVICE

(71) Applicant: CHANGXIN MEMORY TECHNOLOGIES, INC., Hefei (CN)

(72) Inventor: Yupeng Fan, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 186 days.

(21) Appl. No.: 18/448,908

(22) Filed: Aug. 12, 2023

(65) Prior Publication Data

US 2023/0410876 A1 Dec. 21, 2023

Related U.S. Application Data

(63) Continuation of application No. PCT/CN2022/134304, filed on Nov. 25, 2022.

(30) Foreign Application Priority Data

Jun. 21, 2022 (CN) .......................... 202210704011.2

(51) Int. Cl.
*G11C 11/4072* (2006.01)
*G11C 11/4076* (2006.01)
*G11C 11/4093* (2006.01)

(52) U.S. Cl.
CPC ...... *G11C 11/4072* (2013.01); *G11C 11/4076* (2013.01); *G11C 11/4093* (2013.01)

(58) Field of Classification Search
CPC ............ G11C 11/4072; G11C 11/4076; G11C 11/4093; G11C 5/148; G11C 11/4074

(Continued)

(56) References Cited

U.S. PATENT DOCUMENTS 6,851,026 B1  2/2005  Roohparvar
6,870,790 B2 * 3/2005  Horiguchi ............ G11C 7/1072
                                        365/226

(Continued)

FOREIGN PATENT DOCUMENTS

CN   108665918 A   10/2018
CN   110931059 A    3/2020
CN   114185420 A    3/2022

OTHER PUBLICATIONS

International Search Report in the international application No. PCT/CN2022/134304, mailed on Mar. 8, 2023. 6 pages with English translation.

*Primary Examiner* — Fernando Hidalgo
(74) *Attorney, Agent, or Firm* — Syncoda LLC; Feng Ma

(57) ABSTRACT

A semiconductor device includes: a power down control circuit receiving a power down command signal and a chip selection signal, and generating a power down enable signal and a power down exit signal, here, a logic level of the power down enable signal is converted at a first edge of the power down command signal during a power down stage, and a logic level of the power down exit signal is converted at a second edge of the chip selection signal during a power down exit stage; a power control circuit stopping providing a power voltage according to the power down enable signal during the power down stage, and providing the power voltage according to the power down exit signal during the power down exit stage; and an input buffer circuit transmitting signals during the power down exit stage in response to the power down exit signal.

16 Claims, 4 Drawing Sheets

(58) Field of Classification Search
USPC .......................................................... 365/226
See application file for complete search history.

(56) References Cited

U.S. PATENT DOCUMENTS

| | | | |
|---|---|---|---|
| 6,922,758 B2 | 7/2005 | Roohparvar | |
| 7,197,607 B2 | 3/2007 | Roohparvar | |
| 10,366,732 B2 | 7/2019 | Kim | |
| 10,497,411 B2 | 12/2019 | Kim | |
| 10,564,692 B2 | 2/2020 | Choi | |
| 10,706,899 B2 | 7/2020 | Kim | |
| 11,328,751 B2 | 5/2022 | Kim | |
| 11,435,815 B2 | 9/2022 | Kim | |
| 2004/0168016 A1* | 8/2004 | Roohparvar | G06F 12/00 |
| | | | 711/103 |
| 2005/0105369 A1* | 5/2005 | Schoenfeld | G11C 5/14 |
| | | | 365/227 |
| 2005/0219907 A1 | 10/2005 | Roohparvar | |
| 2018/0277178 A1 | 9/2018 | Kim | |
| 2019/0304518 A1 | 10/2019 | Kim | |
| 2019/0304519 A1 | 10/2019 | Kim | |
| 2020/0097064 A1 | 3/2020 | Kim | |
| 2022/0084562 A1* | 3/2022 | Kim | G11C 5/148 |
| 2023/0083475 A1* | 3/2023 | Joo | G06F 1/206 |
| | | | 365/244 |

* cited by examiner

SEMICONDUCTOR DEVICE

CROSS-REFERENCE TO RELATED APPLICATIONS

This is a continuation of International Patent Application No. PCT/CN2022/134304 filed on Nov. 25, 2022, which claims priority to Chinese Patent application No. 202210704011.2 filed on Jun. 21, 2022. The disclosures of the above-referenced applications are hereby incorporated by reference in their entirety.

BACKGROUND

In an IC such as a Dynamic Random Access Memory (DRAM), low power consumption of semiconductor devices has become very important. Several power-saving modes are included in the semiconductor device. In addition to an active mode for normal operations of the semiconductor device, the power-saving modes of the semiconductor device may include an idle mode, a standby power-off mode, a self-refresh mode, and a deep power down mode. The deep power down mode is a very power-saving mode and can ensure the secure storage of data. Coming subsequently, how to ensure normal operations of the semiconductor device after it exits the deep power down mode, has become a key issue to be addressed at present.

SUMMARY

The disclosure relates to the field of integrated circuits (ICs), and in particular to a semiconductor device. Embodiments of the disclosure provide a semiconductor device.

The semiconductor device provided in the embodiments of the disclosure includes a power down control circuit, a power control circuit, and an input buffer circuit.

The power down control circuit receives a power down command signal and a chip selection signal, and generates a power down enable signal and a power down exit signal. Here, a logic level of the power down enable signal is converted at a first edge of the power down command signal during a power down stage, and a logic level of the power down exit signal is converted at a second edge of the chip selection signal during a power down exit stage.

The power control circuit is coupled to the power down control circuit, stops providing a power voltage according to the power down enable signal during the power down stage, and provides the power voltage according to the power down exit signal during the power down exit stage.

The input buffer circuit is coupled to the power down control circuit, and transmits signals during the power down exit stage in response to the power down exit signal.

According to the semiconductor device provided in the embodiments of the disclosure, during the power down exit stage, the logic level of the power down exit signal is converted at the second edge (such as a falling edge) of the chip selection signal rather than at the first edge (such as a rising edge) of the chip selection signal, and the input buffer circuit transmits signals during the power down exit stage in response to the power down exit signal.

DETAILED DESCRIPTION

The semiconductor device provided in the embodiments of the disclosure will be described in detail below with reference to the drawings.

Figure 1:
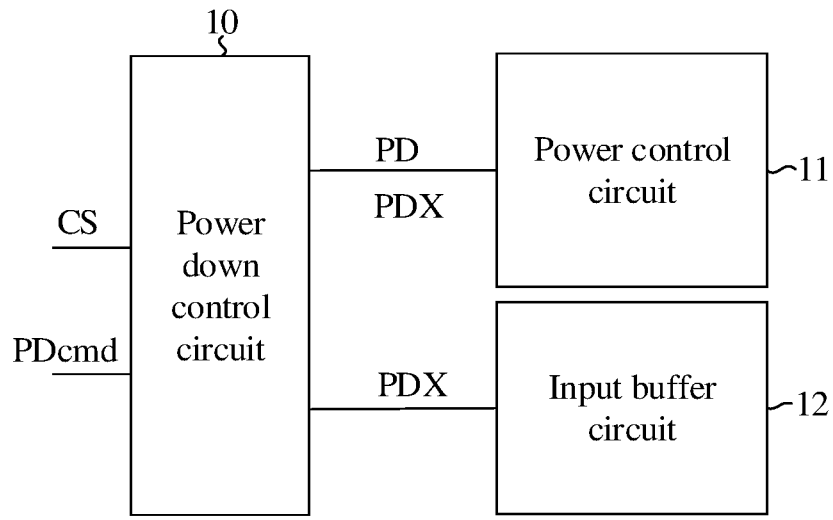
FIG. 1 is a schematic diagram of a semiconductor device according to a first embodiment of the disclosure.

FIG. 1 is a schematic diagram of a semiconductor device according to a first embodiment of the disclosure. With reference to FIG. 1, the semiconductor device includes a power down control circuit 10, a power control circuit 11, and an input buffer circuit 12. The power down control circuit 10 is configured to receive a chip selection signal CS and a power down command signal PDcmd, and generate a power down enable signal PD and a power down exit signal PDX. The power control circuit 11 is coupled to the power down control circuit 10, stops providing a power voltage VDD according to the power down enable signal PD during a power down stage, and provides the power voltage according to the power down exit signal PDX during a power down exit stage. The input buffer circuit 12 is coupled to the power down control circuit 10, and configured to transmit signals during the power down exit stage in response to the power down exit signal PDX.

In the first embodiment, the power down control circuit 10 provides the power down enable signal PD and the power down exit signal PDX during the power down exit stage, to enable the power control circuit 11 and the input buffer circuit 12. The power control circuit 11 is configured to provide the power voltage VDD to internal circuits of the semiconductor device, and the input buffer circuit 12 is configured to transmit signals. Due to long power recovery time, it is necessary to start enabling the power control circuit 11 at a rising edge (a first edge) of the chip selection signal CS, therefore, the power control circuit 11 and the input buffer circuit 12 are enabled simultaneously at the rising edge of the chip selection signal CS. However, the chip selection signal CS is used as one of command encoding signals, when the input buffer circuit 12 is enabled at the rising edge of the chip selection signal CS, it will cause undesired signals to be transmitted into the semiconductor device through the input buffer circuit 12, and the undesired signals are erroneously decoded into commands entering the semiconductor device under action of the signal CS, affecting the reliability of the semiconductor device.

In view of the above reasons, the embodiments of the disclosure provide a semiconductor device, which may prevent undesired signals from being erroneously decoded through the input buffer circuit into commands entering the semiconductor device, and improve the reliability of the semiconductor device.

Figure 2:
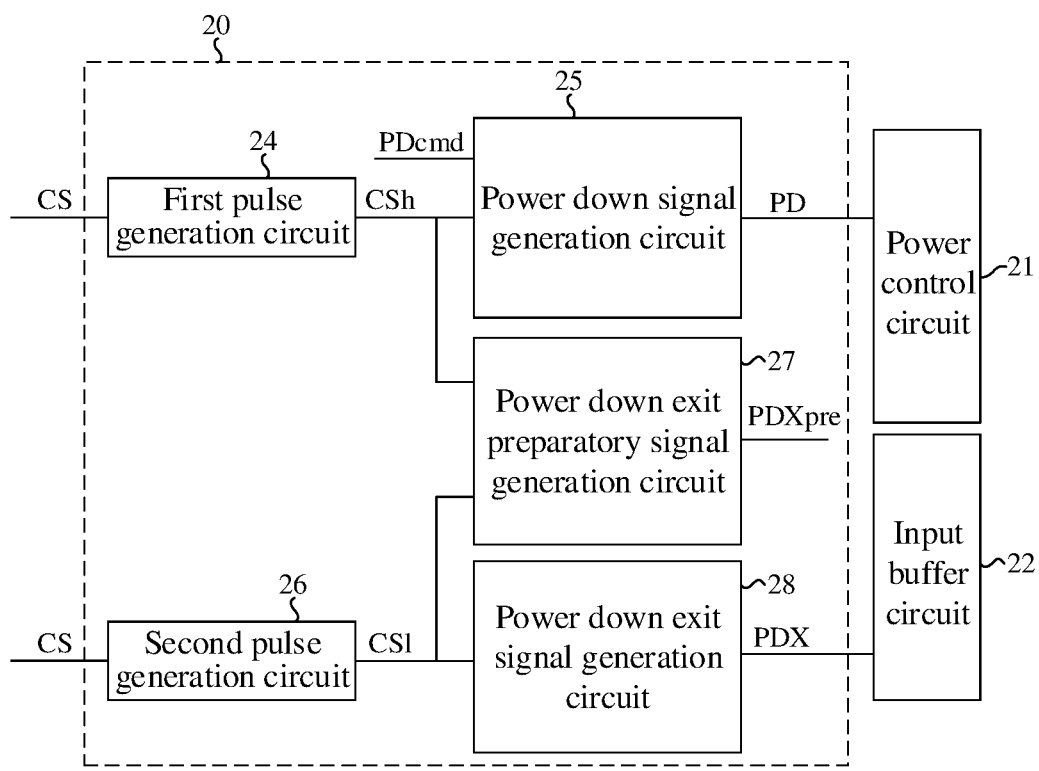
FIG. 2 is a schematic diagram of a semiconductor device according to a second embodiment of the disclosure.
Figure 3:
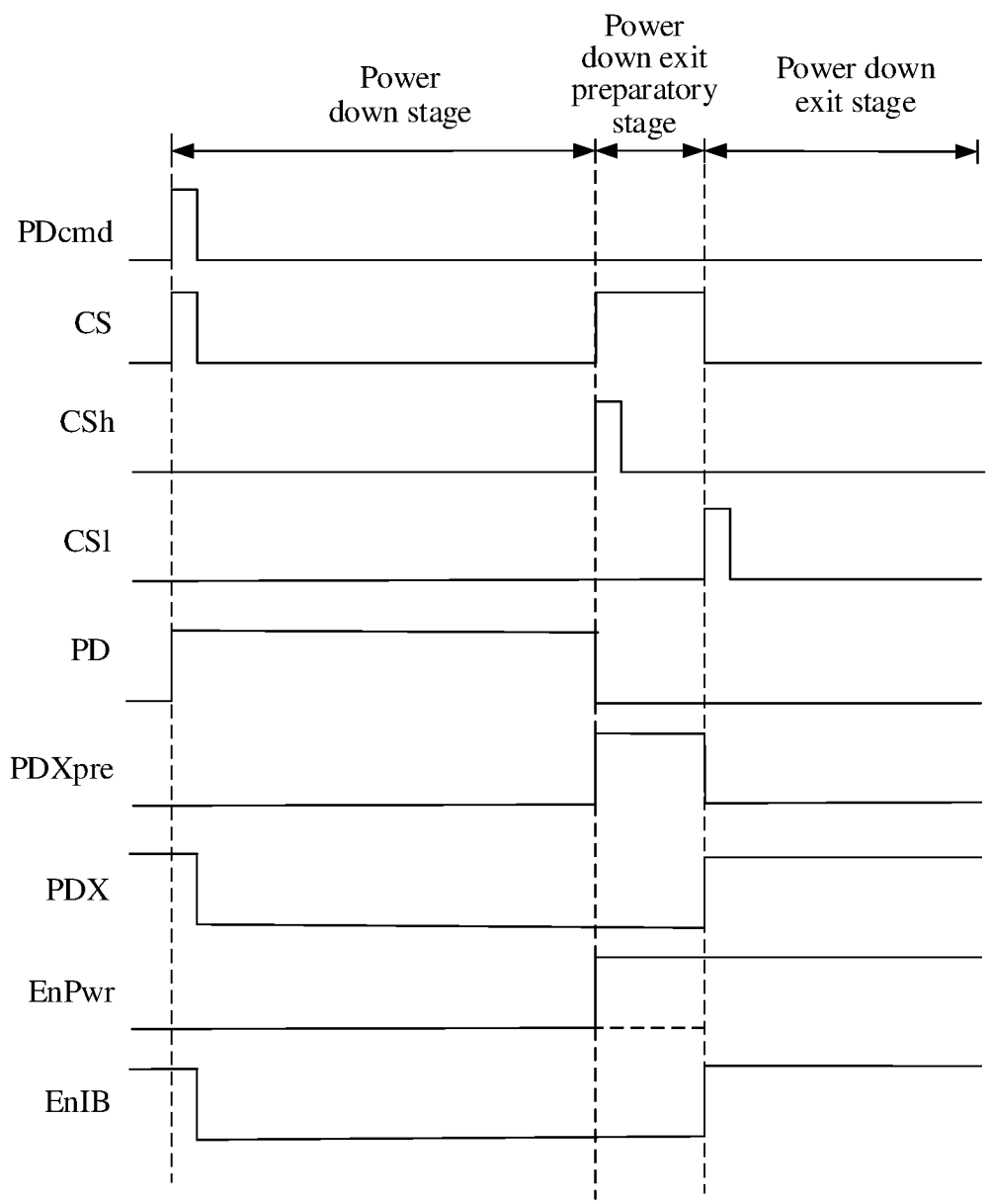
FIG. 3 is a timing diagram of the semiconductor device according to the second embodiment of the disclosure.

FIG. 2 is a schematic diagram of a semiconductor device according to a second embodiment of the disclosure, and FIG. 3 is a timing diagram of the semiconductor device according to the second embodiment of the disclosure.

With reference to FIG. 2 and FIG. 3, the semiconductor device includes a power down control circuit 20, a power control circuit 21, and an input buffer circuit 22. The power down control circuit 20 receives a power down command signal PDcmd and a chip selection signal CS, and generates a power down enable signal PD and a power down exit signal PDX, here, a logic level of the power down enable signal PD is converted at a first edge of the power down command signal PDcmd during a power down stage, and a logic level of the power down exit signal PDX is converted at a second edge of the chip selection signal CS during a power down exit stage. The power control circuit 21 is coupled to the power down control circuit 20, stops providing a power voltage according to the power down enable signal PD during the power down stage, and provides the power voltage according to the power down exit signal PDX during the power down exit stage. The input buffer circuit 22 is coupled to the power down control circuit 20, and transmits signals in response to the power down exit signal PDX during the power down exit stage.

According to the semiconductor device provided in the embodiment of the disclosure, during the power down exit stage, the logic level of the power down exit signal PDX is converted at the second edge (such as a falling edge) of the chip selection signal CS rather than at a first edge (such as a rising edge) of the chip selection signal CS. The input buffer circuit 22 transmits signals during the power down exit stage in response to the power down exit signal PDX. Thus, it can prevent the input buffer circuit 22 from being enabled at the first edge of the chip selection signal CS, and can further prevent undesired signals from being erroneously decoded through the input buffer circuit 22 into commands entering the semiconductor device, and improve the reliability of the semiconductor device.

In the embodiment, converting the logic level of the power down enable signal PD at the first edge of the power down command signal PDcmd marks that the semiconductor device enters the power down stage. When a logic level of the power down command signal PDcmd is a low level, converting a logic level of the chip selection signal CS from a low level to a high level marks that the semiconductor device enters the power down exit stage.

In the embodiment, the first edge of the power down command signal PDcmd refers to a rising edge of the power down command signal PDcmd. That is, in the embodiment, the logic level of the power down enable signal PD is converted at the rising edge of the power down command signal PDcmd. For example, an initial logic level of the power down enable signal PD is a low level, the logic level of the power down enable signal PD is converted from the low level to a high level at the rising edge of the power down command signal PDcmd, and the semiconductor device enters the power down stage.

In the embodiment, the second edge of the chip selection signal CS refers to a falling edge of the chip selection signal CS. That is, in the embodiment, the logic level of the power down exit signal PDX is converted at the falling edge of the chip selection signal CS during the power down exit stage. For example, the logic level of the power down exit signal PDX is a low level during the power down stage, and during the power down exit stage, the logic level of the power down exit signal PDX is converted from the low level to a high level at the falling edge of the chip selection signal CS.

In the embodiment, the power down control circuit 20 includes a first pulse generation circuit 24. The first pulse generation circuit 24 is configured to generate a first pulse CSh according to the chip selection signal CS, here, the first pulse CSh is generated at a first edge of the chip selection signal CS. In the embodiment, the first edge of the chip selection signal CS refers to a rising edge of the chip selection signal CS, that is, the first pulse CSh is generated at the rising edge of the chip selection signal CS.

Figure 4:
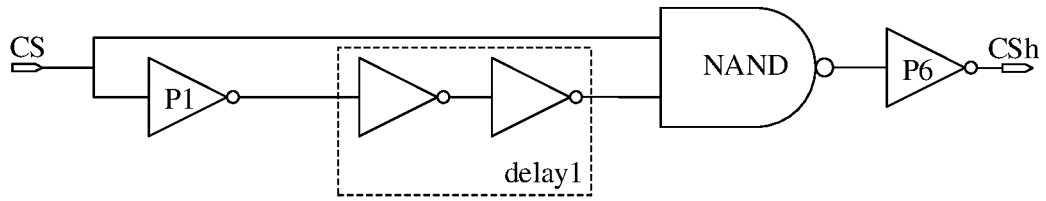
FIG. 4 is a schematic diagram of a first pulse generation circuit according to the second embodiment of the disclosure.

As an example, the embodiments further provide the first pulse generation circuit 24. With reference to FIG. 4, a schematic diagram of the first pulse generation circuit 24 according to the second embodiment of the disclosure is illustrated. The first pulse generation circuit 24 includes a first logic gate circuit, a first delay circuit delay1, and a first inverter P1.

The first logic gate circuit is provided with a first input end receiving the chip selection signal CS, and an output end of an NAND gate circuit NAND outputs the first pulse CSh, and the first logic gate circuit implements an AND logic operation. In the embodiment, the first logic gate circuit includes the NAND gate circuit NAND and an inverter P6. A first input end of the NAND gate circuit NAND receives the chip selection signal CS, the output end of the NAND gate circuit NAND is connected to an input end of the inverter P6, and an output end of the inverter P6 outputs the first pulse CSh.

The first delay circuit delay1 is provided with an output end connected to a second input end of the NAND gate circuit NAND. Here, the first delay circuit delay1 may be a cascade of an even number of inverters. For example, in the embodiment, the first delay circuit delay1 is a cascade of two inverters. In some embodiments, a delay time of the first delay circuit delay1 is less than or equal to a pulse time of the chip selection signal CS, to ensure that the first pulse CSh ends before the second edge of the chip selection signal CS arrives, further ensuring that the first pulse CSh and a second pulse CSl have a set time interval there-between, so that the power control circuit is enabled before the input buffer circuit is enabled.

The first inverter P1 is provided with an input end receiving the chip selection signal CS, and an output end connected to an input end of the first delay circuit delay1.

In some other embodiments, the first logic gate circuit is an AND gate circuit, a first input end of the AND gate circuit receives the chip selection signal CS, a second input end of the AND gate circuit receives an output signal of the first delay circuit delay1, and an output end of the AND gate circuit outputs the first pulse CSh.

In the embodiment, the power down control circuit 20 further includes a power down signal generation circuit 25. The power down signal generation circuit 25 receives the power down command signal PDcmd and the first pulse CSh, and generates the power down enable signal PD, the logic level of the power down enable signal PD is converted at a first edge of the first pulse CSh. For example, in the embodiment, the first edge of the first pulse CSh is a rising edge, the logic level of the power down enable signal PD is a high level during the power down stage, the logic level of the power down enable signal PD is converted from the high level to a low level at the rising edge of the first pulse CSh, and the semiconductor device enters the power down exit stage.

Figure 5:
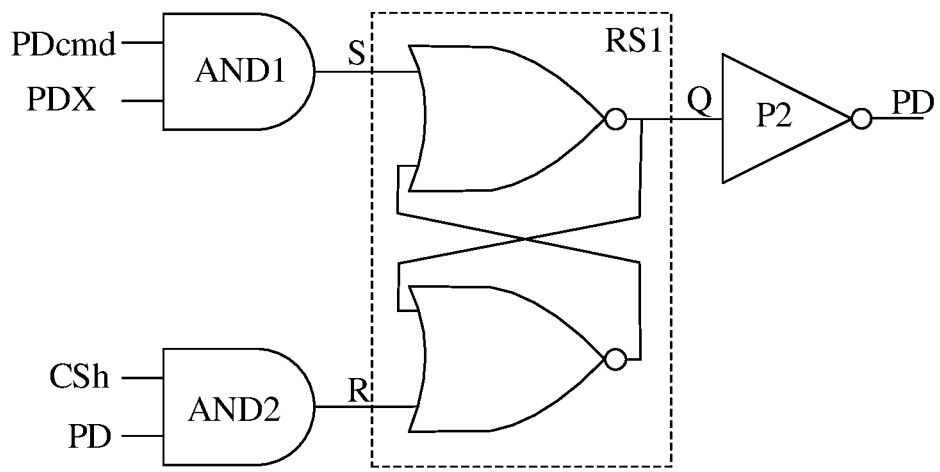
FIG. 5 is a schematic diagram of a power down signal generation circuit according to the second embodiment of the disclosure.

As an example, the embodiments of the disclosure further provide a type of the power down signal generation circuit 25. With reference to FIG. 5, a schematic diagram of the power down signal generation circuit 25 according to the second embodiment of the disclosure is illustrated. The power down signal generation circuit 25 includes a first AND gate AND1, a second AND gate AND2, a first reset/set flip-flop RS1, and a second inverter P2.

The first AND gate AND1 is provided with input ends receiving the power down command signal PDcmd and the power down exit signal PDX respectively. The second AND gate AND2 is provided with input ends receiving the first pulse CSh and the power down enable signal PD respectively. The first reset/set flip-flop RS1 is provided with a set end S connected to an output end of the first AND gate AND1, and a reset end R connected to an output end of the second AND gate AND2. The second inverter P2 is provided with an input end connected to an output end Q of the first reset/set flip-flop RS1, and an output end outputting the power down enable signal PD.

As an example, in the embodiment, the first reset/set flip-flop RS1 is formed of two NAND gates which are cross-connected.

The power control circuit 21 stops providing the power voltage according to the power down enable signal PD during the power down stage. Specifically, during the power down stage, the logic level of the power down enable signal PD is a high level, and a logic level of an enable signal EnPwr of the power control circuit 21 is a low level, thus the power control circuit 21 stops providing the power voltage.

In the embodiment, the power down control circuit 20 further includes a second pulse generation circuit 26. The second pulse generation circuit 26 is configured to generate a second pulse CSl according to the chip selection signal CS, here, the second pulse CSl is generated at the second edge of the chip selection signal CS. In the embodiment, the second edge of the chip selection signal CS refers to a falling edge of the chip selection signal CS, that is, the second pulse CSl is generated at the falling edge of the chip selection signal CS.

Figure 6:
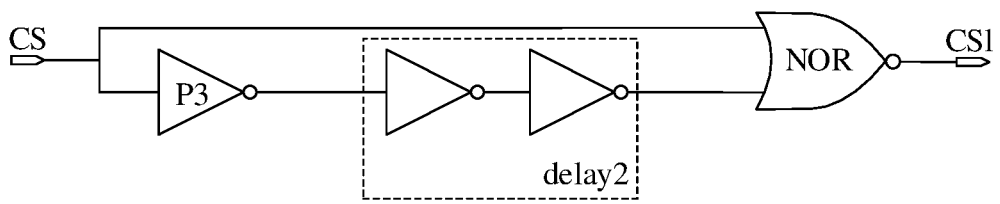
FIG. 6 is a schematic diagram of a second pulse generation circuit according to the second embodiment of the disclosure.

As an example, the embodiments further provide the second pulse generation circuit 26. With reference to FIG. 6, a schematic diagram of the second pulse generation circuit 26 according to the second embodiment of the disclosure is illustrated. The second pulse generation circuit 26 includes an NOR gate circuit NOR, a second delay circuit delay2, and a third inverter P3.

The NOR gate circuit NOR is provided with a first input end receiving the chip selection signal CS, and an output end outputting the second pulse CSl. A logic level of an output signal (i.e. the second pulse CSl) of the output end of the NOR gate circuit NOR is converted from a low level to a high level at the falling edge of the chip selection signal CS.

The second delay circuit delay2 is provided with an output end connected to a second input end of the NOR gate circuit NOR. Here, the second delay circuit delay2 may be a cascade of an even number of inverters. For example, in the embodiment, the second delay circuit delay2 is a cascade of two inverters.

The third inverter P3 is provided with an input end receiving the chip selection signal CS, and an output end connected to an input end of the second delay circuit delay2.

In the embodiment, the power down control circuit 20 further generates a power down exit preparatory signal PDXpre, a logic level of the power down exit preparatory signal PDXpre is converted at the first edge and the second edge of the chip selection signal CS during a power down exit preparatory stage. In the embodiment, the first edge and the second edge of the chip selection signal CS are the rising edge and the falling edge of the chip selection signal CS respectively, here, the first pulse CSh is generated at the rising edge of the chip selection signal CS, the second pulse CSl is generated at the falling edge of the chip selection signal CS, then the logic level of the power down exit preparatory signal PDXpre is converted at a rising edge of the first pulse CSh and at a rising edge of the second pulse CSl.

The logic level of the power down exit preparatory signal PDXpre is a low level during the power down stage, then the logic level of the power down exit preparatory signal PDXpre is converted from the low level to a high level at the rising edge of the chip selection signal CS (i.e., the rising edge of the first pulse CSh), which marks that the semiconductor device enters the power down exit preparatory stage; and the logic level of the power down exit preparatory signal PDXpre is converted from the high level to the low level at the falling edge of the chip selection signal CS (i.e., the rising edge of the second pulse CSl), which marks that the power down exit preparatory stage of the semiconductor device ends. The power down exit preparatory stage is prior to the power down exit stage, and the power down exit stage is entered after the power down exit preparatory stage ends.

In the embodiment, the power control circuit 21 provides the power voltage according to the power down exit preparatory signal PDXpre during the power down exit preparatory stage. That is, in the embodiment, the power control circuit 21 is enabled during the power down exit preparatory stage, to provide the power voltage. However, in another embodiment of the disclosure, the power control circuit 21 provides the power voltage according to the power down exit signal PDX. That is, in another embodiment, the power control circuit 21 still stops providing the power voltage enabled during the power down exit preparatory stage, and the power control circuit 21 is enabled during the power down exit stage, to provide the power voltage.

Specifically, as illustrated in FIG. 3, in the embodiment, an initial logic level of an enable signal EnPwr of the power control circuit 21 is a low level, and the power control circuit 21 stops providing the power voltage; during the power down exit preparatory stage, the logic level of the enable signal EnPwr of the power control circuit 21 is converted from the low level to a high level according to the power down exit preparatory signal PDXpre, and the power control circuit 21 provides the power voltage. In another embodiment, the initial logic level of the enable signal EnPwr of the power control circuit 21 is a low level, and the power control circuit 21 stops providing the power voltage; during the power down exit stage, the logic level of the enable signal EnPwr of the power control circuit 21 is converted from the low level to a high level (as illustrated by dashed lines in the figure) according to the power down exit signal PDX, and the power control circuit 21 provides the power voltage.

In the embodiment, the input buffer circuit 22 stops transmitting signals in response to the power down exit signal PDX during the power down exit preparatory stage. Specifically, during the power down exit preparatory stage, a logic level of the power down exit signal PDX is a low level, and the power down exit signal PDX is used as an enable signal EnIB of the input buffer circuit 22, to control the input buffer circuit 22 to stop transmitting signals during the power down exit preparatory stage. It may be understood that the input buffer circuit 22 also stops transmitting signals according to the power down exit signal PDX during the power down stage. Specifically, during the power down stage, a logic level of the power down exit signal PDX is a low level, and the power down exit signal PDX is used as an enable signal EnIB of the input buffer circuit 22, to control the input buffer circuit 22 to stop transmitting signals during the power down stage.

In some embodiments, the semiconductor device enters the power down exit preparatory stage at the rising edge of the first pulse CSh, and the semiconductor device exits the power down exit preparatory stage at the rising edge of the second pulse CSl. Therefore, a time interval between the first pulse CSh and the second pulse CSl determines a pulse duration of the power down exit preparatory signal PDXpre, that is, a time when the power control circuit is enabled before the input buffer circuit is enabled. Therefore, in order to ensure that the power control circuit can have a sufficient enabling time, the time interval between the first pulse CSh and the second pulse CSl needs to be greater than a set value. For example, in the embodiment, the time interval between the first pulse CSh and the second pulse CSl is greater than or equal to half of a pulse duration of the chip selection signal CS. Since the first pulse CSh is generated at the first edge of the chip selection signal CS, and the second pulse CSl is generated at the second edge of the chip selection signal, the time interval between the first pulse CSh and the second pulse CSl is less than the pulse time of the chip selection signal CS (a time interval between the first edge and the second edge).

In the embodiment, the power down control circuit 20 further includes a power down exit preparatory signal generation circuit 27. The power down exit preparatory signal generation circuit 27 receives the power down enable signal PD, the first pulse CSh and the second pulse CSl, and a logic level of the power down exit preparatory signal PDXpre is converted when the first pulse CSh and the second pulse CSl are received respectively.

Figure 7:
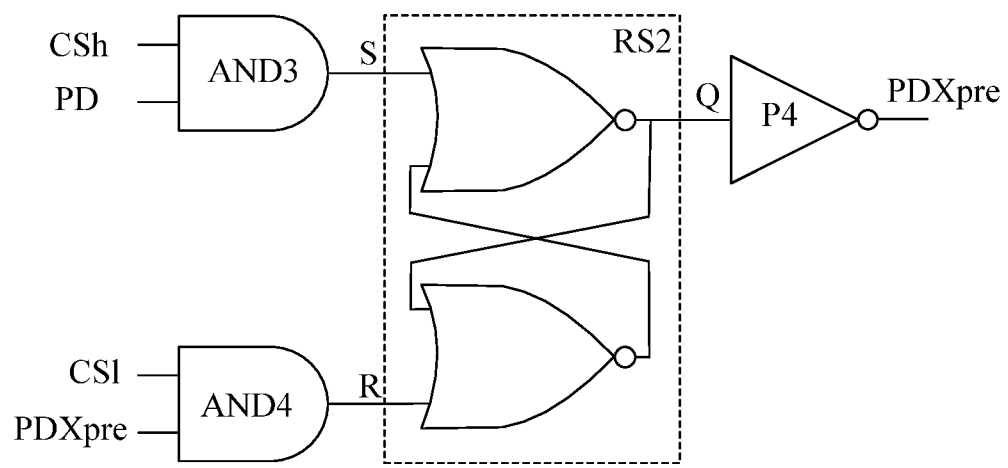
FIG. 7 is a schematic diagram of a power down exit preparatory signal generation circuit according to the second embodiment of the disclosure.

As an example, the embodiments of the disclosure further provide a type of the power down exit preparatory signal generation circuit 27. With reference to FIG. 7, a schematic diagram of the power down exit preparatory signal generation circuit 27 according to the second embodiment of the disclosure is illustrated. The power down exit preparatory signal generation circuit 27 includes a third AND gate AND3, a fourth AND gate AND4, a second reset/set flip-flop RS2, and a fourth inverter P4.

The third AND gate AND3 is provided with input ends receiving the power down enable signal PD and the first pulse CSh respectively. The fourth AND gate AND4 is provided with input ends receiving the power down exit preparatory signal PDXpre and the second pulse CSl respectively. The second reset/set flip-flop RS2 is provided with a set end S connected to an output end of the third AND gate AND3, and a reset end R connected to an output end of the fourth AND gate AND4. The fourth inverter P4 is provided with an input end connected to an output end Q of the second reset/set flip-flop RS2, and an output end outputting the power down exit preparatory signal PDXpre.

As an example, in the embodiment, the second reset/set flip-flop RS2 is formed of two NAND gates which are cross-connected.

In the embodiment, the power down control circuit further includes a power down exit signal generation circuit 28. A logic level of the power down exit signal PDX is converted at a second edge of the power down command signal PDcmd during the power down stage. For example, in the embodiment, the second edge of the power down command signal PDcmd is a falling edge, and an initial logic level of the power down exit signal PDX is a high level, then the logic level of the power down exit signal PDX is converted from the high level to a low level at the falling edge of the power down command signal PDcmd during the power down stage. The logic level of the power down exit signal PDX is maintained at the low level during a subsequent power down stage; the logic level of the power down exit signal PDX is maintained at the low level during the power down exit preparatory stage; the logic level of the power down exit signal PDX is converted into the high level when the power down exit stage is entered; and the logic level of the power down exit signal PDX is maintained at the high level during the power down exit stage.

Figure 8:
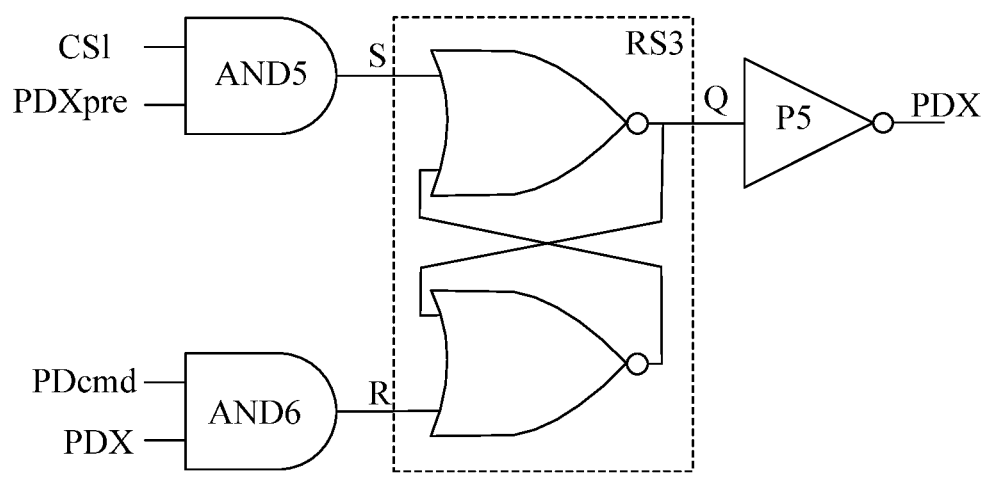
FIG. 8 is a schematic diagram of a power down exit signal generation circuit according to the second embodiment of the disclosure.

As an example, the embodiments of the disclosure further provide a type of the power down exit signal generation circuit 28. With reference to FIG. 8, a schematic diagram of the power down exit signal generation circuit 28 according to the second embodiment of the disclosure is illustrated. The power down exit signal generation circuit 28 includes a fifth AND gate AND5, a sixth AND gate AND6, a third reset/set flip-flop RS3, and a fifth inverter P5.

The fifth AND gate AND5 is provided with input ends receiving the power down exit preparatory signal PDXpre and the second pulse CSl respectively. The sixth AND gate AND6 is provided with input ends receiving the power down command signal PDcmd and the power down exit signal PDX respectively. The third reset/set flip-flop RS3 is provided with a set end S connected to an output end of the fifth AND gate AND5, and a reset end R connected to an output end of the sixth AND gate AND6. The fifth inverter P5 is provided with an input end connected to an output end Q of the third reset/set flip-flop RS3, and an output end outputting the power down exit signal PDX.

During the power down exit stage, the input buffer circuit 22 transmits signals during the power down exit stage in response to the power down exit signal PDX. Specifically, in the embodiment, the power down exit signal PDX is used as an enable signal EnIB of the input buffer circuit 22. A logic level of the power down exit signal PDX is a low level during the power down stage and during the power down exit preparatory stage, then a logic level of the enable signal EnIB of the input buffer circuit 22 is a low level, the input buffer circuit 22 is not enabled and stops transmitting signals; the logic level of the power down exit signal PDX is a high level during the power down exit stage, then the enable signal EnIB of the input buffer circuit 22 is a high level, the input buffer circuit 22 is enabled and transmits signals.

According to the semiconductor device provided in the embodiments of the disclosure, during the power down exit stage, the logic level of the power down exit signal PDX is converted at the second edge (such as a falling edge) of the chip selection signal CS rather than at the first edge (such as a rising edge) of the chip selection signal. The input buffer circuit 22 transmits signals during the power down exit stage in response to the power down exit signal PDX. Thus, it can prevent the input buffer circuit 22 from being enabled at the first edge of the chip selection signal CS, and can further prevent undesired signals from being erroneously decoded through the input buffer circuit 22 into commands entering the semiconductor device, and improve the reliability of the semiconductor device.

In the embodiment, the semiconductor device is a memory, and the reliability of the memory is improved significantly.

In the embodiment, the chip selection signal CS is input into the first pulse generation circuit 24 and the second pulse generation circuit 26 through a buffer circuit, and the power down exit signal PDX is inverted to be used as an enable signal of the buffer circuit. As illustrated in FIG. 3, at the beginning of the power down stage, the chip selection signal CS generates a small pulse, while the power control circuit 21 and the input buffer circuit 22 are not enabled according to the pulse, that is, the pulse is an interference signal. In order to avoid influence of the pulse on the semiconductor device, the semiconductor device uses a reverse signal of the power down exit signal PDX as the enable signal of the buffer circuit, and the buffer circuit is not enabled at the pulse, that is, the first and second pulses are not generated at the pulse, thereby shielding the pulse and avoid its influence on the power control circuit 21 and the input buffer circuit 22.

The foregoing are merely preferred embodiments of the disclosure. It should be pointed out that several improvements and embellishments may also be made by those of ordinary skill in the art without departing from the principle of the disclosure, and these improvements and embellishments should also be considered as the scope of protection of the disclosure.

The invention claimed is:

1. A semiconductor device, comprising:
a power down control circuit, receiving a power down command signal and a chip selection signal, and generating a power down enable signal and a power down exit signal, wherein a logic level of the power down enable signal is converted at a first edge of the power down command signal during a power down stage, and a logic level of the power down exit signal is converted at a second edge of the chip selection signal during a power down exit stage;
a power control circuit, coupled to the power down control circuit, wherein the power control circuit stops providing a power voltage according to the power down enable signal during the power down stage, and provides the power voltage according to the power down exit signal during the power down exit stage; and
an input buffer circuit, coupled to the power down control circuit, and transmitting signals during the power down exit stage in response to the power down exit signal.

2. The semiconductor device of claim 1, wherein the power down control circuit comprises:
a first pulse generation circuit, configured to generate a first pulse according to the chip selection signal, wherein the first pulse is generated at a first edge of the chip selection signal.

3. The semiconductor device of claim 2, wherein the first pulse generation circuit comprises:
a first logic gate circuit, provided with a first input end receiving the chip selection signal, and an output end outputting the first pulse;
a first delay circuit, provided with an output end connected to a second input end of the first logic gate circuit; and
a first inverter, provided with an input end receiving the chip selection signal, and an output end connected to an input end of the first delay circuit.

4. The semiconductor device of claim 2, wherein the power down control circuit further comprises:
a power down signal generation circuit, receiving the power down command signal and the first pulse, and generating the power down enable signal, wherein the logic level of the power down enable signal is converted at a first edge of the first pulse.

5. The semiconductor device of claim 4, wherein the power down signal generation circuit comprises:

a first AND gate, provided with input ends receiving the power down command signal and the power down exit signal respectively;
a second AND gate, provided with input ends receiving the first pulse and the power down enable signal respectively;
a first reset/set flip-flop, provided with a set end connected to an output end of the first AND gate, and a reset end connected to an output end of the second AND gate; and
a second inverter, provided with an input end connected to an output end of the first reset/set flip-flop, and an output end outputting the power down enable signal.

6. The semiconductor device of claim 4, wherein the power down control circuit further generates a power down exit preparatory signal, a logic level of the power down exit preparatory signal is converted at the first edge and the second edge of the chip selection signal during a power down exit preparatory stage, and wherein the power control circuit provides the power voltage according to the power down exit preparatory signal during the power down exit preparatory stage.

7. The semiconductor device of claim 6, wherein the input buffer circuit stops transmitting signals in response to the power down exit signal during the power down exit preparatory stage.

8. The semiconductor device of claim 6, wherein the power down control circuit further comprises:
a second pulse generation circuit, configured to generate a second pulse according to the chip selection signal, wherein the second pulse is generated at the second edge of the chip selection signal.

9. The semiconductor device of claim 8, wherein the second pulse generation circuit comprises:
an NOR gate circuit, provided with a first input end receiving the chip selection signal, and an output end outputting the second pulse;
a second delay circuit, provided with an output end connected to a second input end of the NOR gate circuit; and
a third inverter, provided with an input end receiving the chip selection signal, and an output end connected to an input end of the second delay circuit.

10. The semiconductor device of claim 8, wherein the power down control circuit further comprises:
a power down exit preparatory signal generation circuit, receiving the power down enable signal, the first pulse and the second pulse, wherein a logic level of the power down exit preparatory signal is converted when the first pulse and the second pulse are received respectively.

11. The semiconductor device of claim 10, wherein the power down exit preparatory signal generation circuit comprises:
a third AND gate, provided with input ends receiving the power down enable signal and the first pulse respectively;
a fourth AND gate, provided with input ends receiving the power down exit preparatory signal and the second pulse respectively;
a second reset/set flip-flop, provided with a set end connected to an output end of the third AND gate, and a reset end connected to an output end of the fourth AND gate; and
a fourth inverter, provided with an input end connected to an output end of the second reset/set flip-flop, and an output end outputting the power down exit preparatory signal.

12. The semiconductor device of claim 8, wherein the power down control circuit further comprises:
- a power down exit signal generation circuit, wherein a logic level of the power down exit signal is converted at a second edge of the power down command signal during the power down stage.

13. The semiconductor device of claim 12, wherein the power down exit signal generation circuit comprises:
- a fifth AND gate, provided with input ends receiving the power down exit preparatory signal and the second pulse respectively;
- a sixth AND gate, provided with input ends receiving the power down command signal and the power down exit signal respectively;
- a third reset/set flip-flop, provided with a set end connected to an output end of the fifth AND gate, and a reset end connected to an output end of the sixth AND gate; and
- a fifth inverter, provided with an input end connected to an output end of the third reset/set flip-flop, and an output end outputting the power down exit signal.

14. The semiconductor device of claim 1, wherein the first edge of the power down command signal is a rising edge.

15. The semiconductor device of claim 1, wherein the second edge of the chip selection signal is a falling edge.

16. The semiconductor device of claim 1, wherein the semiconductor device is a memory.

* * * * *